United States Patent
Hagihara

(10) Patent No.: US 9,294,114 B2
(45) Date of Patent: Mar. 22, 2016

(54) REFERENCE SIGNAL GENERATING CIRCUIT, AD CONVERSION CIRCUIT, AND IMAGING DEVICE

(71) Applicant: OLYMPUS CORPORATION, Tokyo (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 190 days.

(21) Appl. No.: 14/090,569

(22) Filed: Nov. 26, 2013

(65) Prior Publication Data

US 2014/0183336 A1 Jul. 3, 2014

(30) Foreign Application Priority Data

Dec. 27, 2012 (JP) ................. 2012-284605

(51) Int. Cl.
| | |
|---|---|
| *H03K 3/01* | (2006.01) |
| *G01J 1/44* | (2006.01) |
| *H03M 1/34* | (2006.01) |
| *H04N 5/376* | (2011.01) |
| *H04N 5/378* | (2011.01) |

(Continued)

(52) U.S. Cl.
CPC ............ *H03M 1/34* (2013.01); *H03M 1/56* (2013.01); *H04N 5/378* (2013.01); *H04N 5/3765* (2013.01); *H03K 2005/00241* (2013.01)

(58) Field of Classification Search
CPC ........... H03M 1/34; H03M 1/56; H03M 1/50; H03M 1/1014; H03M 1/66; H03M 1/742; H04N 5/376; H04N 5/3765; H04N 5/378; H04N 5/374; H03K 2005/00241; H03K 2005/00247; H03K 2005/00267
See application file for complete search history.

(56) References Cited

U.S. PATENT DOCUMENTS

| 8,310,390 B2 * | 11/2012 | Hagihara ................. 341/166 |
| 8,344,782 B2 * | 1/2013 | Behrends et al. ........... 327/263 |
| 8,648,290 B2 * | 2/2014 | Hagihara .................. 250/208.1 |

(Continued)

FOREIGN PATENT DOCUMENTS

| JP | 2007-88971 A | 4/2007 |
| JP | 2011-250009 A | 12/2011 |
| JP | 2013-70331 A | 4/2013 |

OTHER PUBLICATIONS

Office Action dated Feb. 3, 2015, issued in corresponding Japanese application No. 2012-284605, with English translation (6 pages).

*Primary Examiner* — John Lee
(74) *Attorney, Agent, or Firm* — Westerman, Hattori, Daniels & Adrian, LLP

(57) ABSTRACT

A reference signal generating circuit, an AD conversion circuit, and an imaging device are provided. A clock generating unit includes a delay section including delay units, each of which delays an input signal and outputs a delayed signal, and outputs a low-order phase signal based on a signal output from the delay section. A high-order current source cell unit includes high-order current source cells, each of which generates the same constant current. A low-order current source cell unit includes low-order current source cells weighted to generate constant currents having current values that differ by a predetermined proportion of a current value of the constant current generated by the high-order current source cell. Selection of the high-order current source cell is performed based on a clock obtained by dividing a clock based on the low-order phase signal.

10 Claims, 12 Drawing Sheets

(51) Int. Cl.
*H03M 1/56* (2006.01)
*H03K 5/00* (2006.01)

(56) References Cited

U.S. PATENT DOCUMENTS

| | | | |
|---|---|---|---|
| 2006/0244649 A1* | 11/2006 | Terazawa et al. | 341/155 |
| 2007/0194962 A1* | 8/2007 | Asayama et al. | 341/144 |
| 2008/0224913 A1* | 9/2008 | Suzuki et al. | 341/155 |
| 2011/0080507 A1* | 4/2011 | Iwasa | 348/302 |
| 2011/0210882 A1* | 9/2011 | Koyama et al. | 341/166 |
| 2011/0221619 A1* | 9/2011 | Asayama et al. | 341/144 |
| 2011/0233381 A1* | 9/2011 | Kume | 250/208.1 |
| 2011/0292260 A1* | 12/2011 | Hagihara | 348/294 |
| 2012/0138772 A1* | 6/2012 | Hagihara | 250/208.1 |
| 2012/0229666 A1* | 9/2012 | Hagihara | 348/222.1 |
| 2012/0249850 A1* | 10/2012 | Hagihara | 348/302 |
| 2012/0305752 A1* | 12/2012 | Shimizu et al. | 250/208.1 |
| 2013/0105665 A1* | 5/2013 | Tanaka et al. | 250/208.1 |
| 2013/0121455 A1* | 5/2013 | Koyama | 377/54 |
| 2013/0146751 A1* | 6/2013 | Hagihara | 250/208.1 |
| 2014/0036122 A1* | 2/2014 | Hagihara | 348/302 |
| 2014/0036125 A1* | 2/2014 | Hagihara | 348/308 |
| 2014/0061437 A1* | 3/2014 | Yamazaki | 250/208.1 |
| 2014/0077065 A1* | 3/2014 | Hagihara | 250/208.1 |
| 2014/0183336 A1* | 7/2014 | Hagihara | 250/208.1 |
| 2015/0144771 A1* | 5/2015 | Hagihara | 250/208.1 |

* cited by examiner

REFERENCE SIGNAL GENERATING CIRCUIT, AD CONVERSION CIRCUIT, AND IMAGING DEVICE

BACKGROUND OF THE INVENTION

1. Field of the Invention

The present invention relates to a reference signal generating circuit that generates a reference signal which is compared with an analog signal at the time of AD conversion. Furthermore, the present invention relates to an AD conversion circuit and an imaging device which include the reference signal generating circuit.

Priority is claimed on Japanese Patent Application No. 2012-284605, filed Dec. 27, 2012, the content of which is incorporated herein by reference.

2. Description of Related Art

As an example using a reference signal generating circuit according to a related art, there is an imaging device. Japanese Unexamined Patent Application, First Publication No. 2011-250009 discloses an imaging device in which an AD conversion circuit (ADC) is arranged for each pixel column. FIG. 9 illustrates an exemplary constitution of an imaging device which is almost the same to the imaging device disclosed in Japanese Unexamined Patent Application, First Publication No. 2011-250009. A solid state imaging device 1001 illustrated in FIG. 9 includes an imaging unit 1002, a read current source unit 1005, an analog unit 1006, a reference signal generating circuit 1010, a vertical selecting unit 1012, a horizontal selecting unit 1014, an ADC group 1015, an output unit 1017, and a control unit 1020.

The imaging unit 1002 includes a photodiode (a photoelectric conversion element) and an intra-pixel amplifier, and unit pixels 1003, each of which outputs a pixel signal according to the amount of an incident light are arranged in the form of a matrix. The control unit 1020 is a control circuit that reads a pixel signal from the imaging unit 1002 and performs AD conversion on the read pixel signal. The vertical selecting unit 1012 performs control of a row address or row scanning of the imaging unit 1002 through a row control line 1011. The horizontal selecting unit 1014 performs control of a column address or column scanning of the ADC group 1015. The read current source unit 1005 is a current source that reads a pixel signal from the imaging unit 1002 as a voltage signal. The analog unit 1006 performs amplification and the like as necessary.

The reference signal generating circuit 1010 includes a clock generating unit 1018 and a ramp wave generating unit 1019, and generates a ramp wave as a reference signal whose voltage value increases or decreases with the passage of time. The clock generating unit 1018 includes a voltage-controlled oscillator (VCO) 1018a, and generates a clock signal used to drive the ramp wave generating unit 1019 based on a pulse signal applied from the control unit 1020. The ramp wave generating unit 1019 generates the ramp wave based on the clock signal applied from the clock generating unit 1018.

The ADC group 1015 has column ADC units 1016 which is arranged for each of vertical signal line 1013 corresponding to a pixel column. The column ADC units 1016 has an n-bit (n is a natural number of 2 or more) digital signal conversion function. The column ADC unit 1016 constitutes an analog-digital conversion means (AD conversion circuit) that converts an analog pixel signal read from the unit pixel 1003 of a selected pixel row of the imaging unit 1002 into digital pixel data together with the reference signal generating circuit 1010.

The column ADC unit 1016 includes a comparing unit 1109, a latch unit 1108, a counter 1103, and a memory unit 1104. The comparing unit 1109 compares the ramp wave from the reference signal generating circuit 1010 with the analog signal obtained through each vertical signal line 1013 from the unit pixel 1003 for each row control line 1011. The latch unit 1108 includes a latch circuit that latches (holds/stores) a logical state of a low-order phase signal composed of a plurality of clock signals output from the clock generating unit 1018. The counter 1103 counts one of the clock signals configuring the low-order phase signal as a count clock. The comparing unit 1109 compares the ramp wave with the analog signal during a period of time corresponding to a voltage of a pixel signal, and a result of measuring the period of time is obtained as data of the logical state of the low-order phase signal latched by the latch unit 1108 and data of a result of counting through the counter 1103.

The data latched by the latch unit 1108 and the counter 1103 is transferred to the memory unit 1104. The memory unit 1104 is connected to a horizontal transfer line 1021. The output unit 1017 includes a sense amplifier circuit, performs binarization and subtraction on data output to the horizontal transfer line 1021, and outputs final AD conversion result data to the outside of the imaging device 1001.

Next, an operation of the imaging device 1001 will be described. As analog pixel signals read from the unit pixels 1003 of a selected row of the imaging unit 1002, a reset level including noise of a pixel signal is read during a first read operation, and then a signal level is read during a second read operation. Then, the reset level and the signal level are input to the ADC group 1015 in time series through the vertical signal line 1013.

After the first read operation from the unit pixels 1003 of an arbitrary row to the vertical signal line 1013 is stabilized, the ramp wave (reference signal) obtained by temporally changing a reference voltage is generated by the reference signal generating circuit 1010 and input to the comparing unit 1109. The comparing unit 1109 compares a voltage of the ramp wave with a voltage of the analog signal of the vertical signal line 1013. In parallel with input of the ramp wave to the comparing unit 1109, a first count is performed by the counter 1103.

When a relationship representing whether the voltage of the ramp wave is higher or lower than the voltage of the analog signal of the vertical signal line 1013 is reversed, an output of the comparing unit 1109 is inverted, and at the same time, data corresponding to a period of time during which the comparing unit 1109 performs a comparison is latched in the latch unit 1108 and the counter 1103. When the first read operation is performed, since a variation in the reset level of the unit pixel 1003 is usually small and a reset voltage is common to all pixels, a voltage of the analog signal output to an arbitrary vertical signal line 1013 is approximately equal to a known value. Thus, when the first read operation is performed, the comparison period of time can be reduced by appropriately adjusting the voltage of the ramp wave. The data latched in the latch unit 1108 and the counter 1103 is transferred to the memory unit 1104.

When the second read operation is performed, in addition to the reset level, a signal level of each unit pixel 1003 corresponding to the amount of an incident light is read, and the same operation as in the first read operation is performed. In other words, when the second read operation from the unit pixels 1003 of an arbitrary row to the vertical signal line 1013 is stabilized, the ramp wave is generated by the reference signal generating circuit 1010 and then input to the comparing unit 1109. The comparing unit 1109 compares a voltage of the ramp wave with a voltage of the analog signal of the vertical signal line 1013. In parallel with input of the ramp wave to the comparing unit 1109, a second count is performed by the counter 1103.

When a relationship representing whether the voltage of the ramp wave is higher or lower than the voltage of the analog signal of the vertical signal line 1013 is reversed, an output of the comparing unit 1109 is inverted, and at the same time, data corresponding to a period of time during which the comparing unit 1109 performs a comparison is latched in the latch unit 1108 and the counter 1103. The data latched in the latch unit 1108 and the counter 1103 is transferred to the memory unit 1104.

After the second read operation ends, the first data and the second data held in the memory unit 1104 are detected by (the sense amplifier circuit of) the output unit 1017 via the horizontal transfer line 1021 through the horizontal selecting unit 1014. Then, in the output unit 1017, binarization of the data latched in the latch unit 1108 is performed, and the data obtained in the first read operation is subtracted from the data obtained in the second read operation, and then the subtracted data is output to the outside. Thereafter, the same operation is sequentially performed for each row, and thus a two-dimensional image is generated. The binarization and the subtraction may be performed in the column ADC unit 1016.

A reference signal generating circuit of an imaging device employing an AD conversion circuit of a time to digital converter (tdc) type single slope (SS) generates the ramp wave (reference signal) using an annular delay circuit. This is because a circuit size can be reduced by using an output of an annular delay circuit as both a low-order phase signal for a latch and a signal for ramp wave generation.

SUMMARY OF THE INVENTION

According to a first aspect of the present invention, a reference signal generating circuit includes a clock generating unit that includes a delay section including a plurality of delay units, each of which delays an input signal and outputs a delayed signal, and outputs a low-order phase signal based on a signal output from the delay section, a high-order current source cell unit that includes high-order current source cells, each of which generates the same constant current, a low-order current source cell unit that includes a plurality of low-order current source cells weighted to generate constant currents having current values that differ by a predetermined proportion of a current value of the constant current generated by the high-order current source cell, an adding unit that adds the constant currents output from the high-order current source cell unit and the low-order current source cell unit, and a converting unit that converts an electric current obtained by addition by the adding unit into a voltage, and outputs the voltage, wherein selection of the high-order current source cell is performed based on a clock obtained by dividing a clock based on the low-order phase signal, and selection of the low-order current source cell is performed based on a pulse that is generated at a time interval based on a period of the clock used for selection of the high-order current source cell and generated at a timing based on rising or falling of a clock based on the low-order phase signal.

Furthermore, according to a second aspect of the present invention, a reference signal generating circuit includes a clock generating unit that includes a delay section including a plurality of delay units, each of which delays an input signal and outputs a delayed signal, and outputs a low-order phase signal based on a signal output from the delay section, a high-order current source cell unit that includes high-order current source cells, each of which generates the same constant current, a low-order current source cell unit that includes a plurality of low-order current source cells, each of which generates a constant current having a current value of a predetermined proportion of a current value of the constant current generated by the high-order current source cell, an adding unit that adds the constant currents output from the high-order current source cell unit and the low-order current source cell unit, and a converting unit that converts an electric current obtained by addition by the adding unit into a voltage, and outputs the voltage, wherein selection of the high-order current source cell is performed based on a clock obtained by dividing a clock based on the low-order phase signal, and selection of the low-order current source cell is performed based on a pulse that is generated at a timing based on rising or falling of a clock based on the low-order phase signal and generated at a time interval based on a period of the clock used for selection of the high-order current source cell.

Furthermore, according to a third aspect of the present invention, in the reference signal generating circuit according to the first or second aspect, selection of the low-order current source cell is performed based on a clock obtained by dividing a clock based on the low-order phase signal.

Furthermore, according to a fourth aspect of the present invention, in the reference signal generating circuit according to the first or second aspect, the delay section is an annular delay circuit including the delay units which are connected in a ring form.

Furthermore, according to a fifth aspect of the present invention, an AD conversion circuit includes the reference signal generating circuit according to the first or second aspect, a comparing unit that compares an analog signal serving as an AD conversion target with a reference signal based on the voltage output from the converting unit of the reference signal generating circuit, and ends a comparison process at a timing at which the reference signal satisfies a predetermined condition for the analog signal, a latch unit that latches the low-order phase signal at a timing related to an end of the comparison process, and a counter that counts a clock based on the low-order phase signal as a count clock, and acquires a high-order count value.

Furthermore, according to a sixth aspect of the present invention, an imaging device includes an imaging unit that includes a plurality of pixels, each of which includes a photoelectric conversion element and outputs a pixel signal, the plurality of pixels being arranged in a matrix form, and the AD conversion circuit according to the fifth aspect to which the analog signal corresponding to the pixel signal is input.

DETAILED DESCRIPTION OF THE INVENTION

Hereinafter, exemplary embodiments of the present invention will be described with reference to the appended drawings.

First Embodiment

Figure 1:
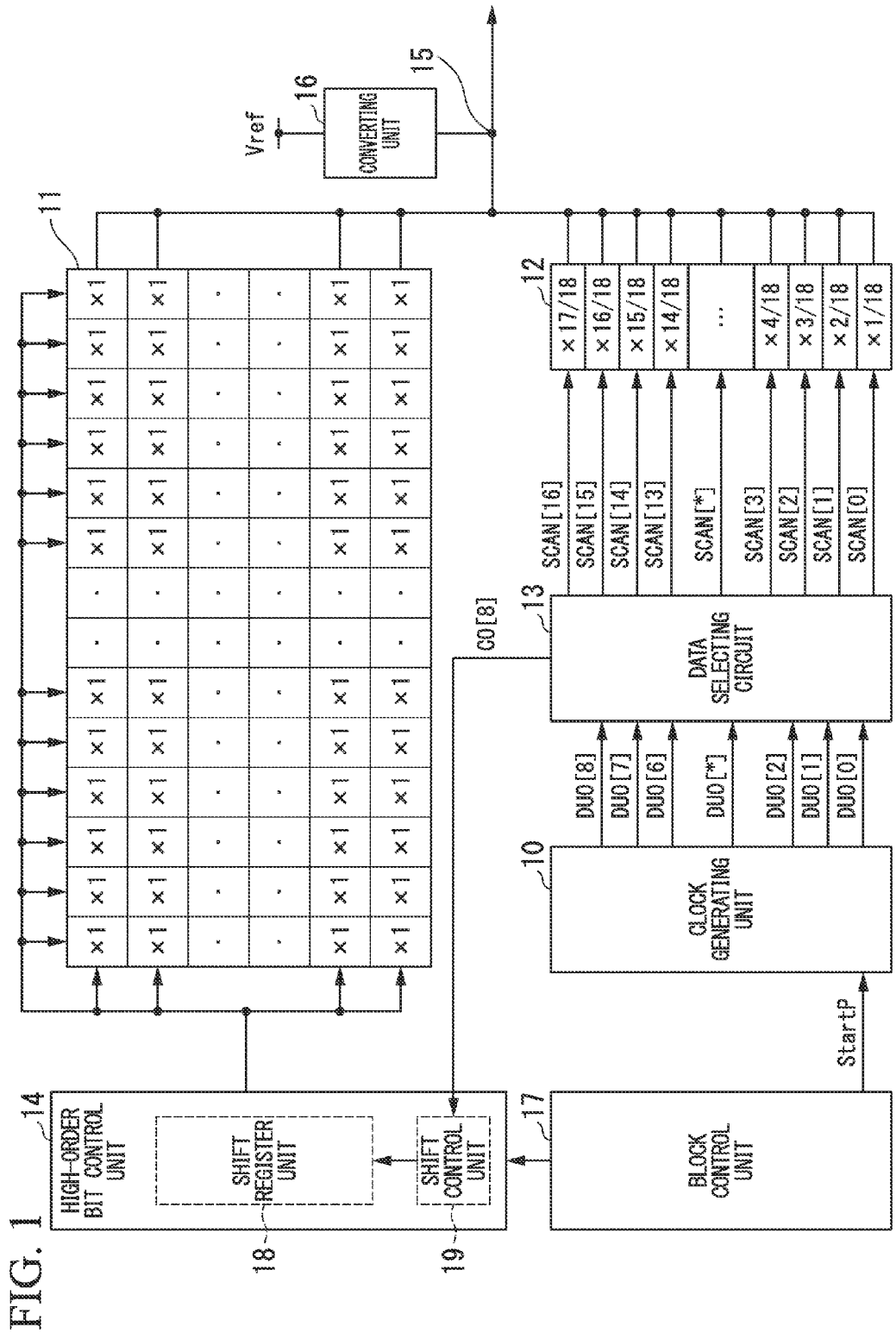
FIG. 1 is a block diagram illustrating a constitution of a reference signal generating circuit according to a first embodiment of the present invention.

First of all, a first embodiment of the present invention will be described. FIG. 1 illustrates an exemplary constitution of a reference signal generating circuit according to the present embodiment. A reference signal generating circuit illustrated in FIG. 1 includes a clock generating unit 10, a high-order current source cell unit 11, a low-order current source cell unit 12, a data selecting circuit 13, a high-order bit control unit 14, an adding unit 15, a converting unit 16, and a block control unit 17.

The clock generating unit 10 generates and outputs clock signals DUO[0] to DUO[8] having a phase difference therebetween. The clock signals DUO[0] to DUO[8] configure a low-order phase signal in AD conversion.

The high-order current source cell unit 11 includes a plurality of high-order current source cell, (cells indicated by "×1" in FIG. 1), each of which generates the same constant current. The high-order current source cells are arranged in the form of a matrix.

The low-order current source cell unit 12 includes a plurality of low-order current source cells (cells indicated by "×1/18," "×2/18," . . . , and "×17/18" in FIG. 1) which are weighted to generate respective current values that differ by eighteenths (1/18) from respective current values of respective constant currents generated by the respective high-order current source cells constituting the high-order current source cell unit 11. In other words, when a current value of a constant current generated by a certain high-order current source cell is I, the respective low-order current source cells constituting the low-order current source cell unit 12 generate respective electric currents having current values of I/18, 2×I/18, . . . , and 17×I/18.

The data selecting circuit 13 generates low-order selection signals SCAN[0] to SCAN[17] used to select the low-order current source cell that outputs an electric current from among the low-order current source cells constituting the low-order current source cell unit 12 based on the clock signals DUO[0] to DUO[8] received from the clock generating unit 10, and outputs the low-order selection signals SCAN[0] to SCAN[17] to the low-order current source cell unit 12. The 17 low-order current source cells constituting the low-order current source cell unit 12 are selected by the low-order selection signals SCAN[0] to SCAN[16].

The high-order bit control unit 14 selects the high-order current source cells of the high-order current source cell unit 11 based on a clock signal CO[8] output from the data selecting circuit 13. The high-order bit control unit 14 includes a shift register unit 18 that generates a signal used to select the high-order current source cell, and outputs the generated signal to the high-order current source cell unit 11 and a shift control unit 19 that generates a shift clock causing the shift register unit 18 to perform a shift operation based on the clock signal CO[8] output from the data selecting circuit 13.

The adding unit 15 adds the constant currents output from the high-order current source cells constituting the high-order current source cell unit 11 and the low-order current source cells constituting the low-order current source cell unit 12, and outputs the resultant current. The converting unit 16 converts the electric current output from the adding unit 15 into a voltage signal, and outputs the voltage signal as a reference signal to be compared with the analog signal at the time of AD conversion. The converting unit 16 is considered to include, but is not limited to, for example, a resistive element or a capacitive element. The block control unit 17 controls the above-described components.

Figure 2:
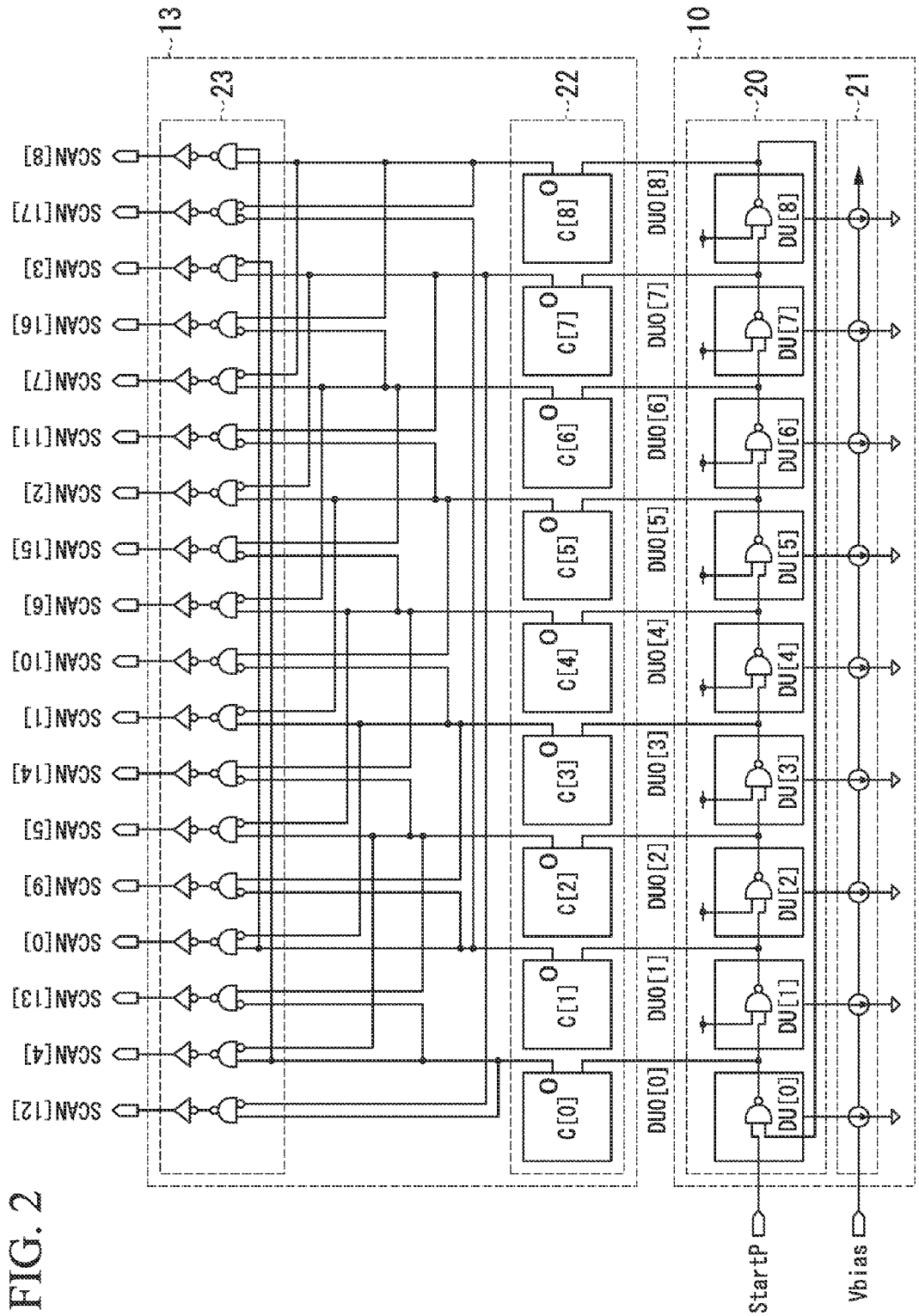
FIG. 2 is a circuit diagram illustrating constitutions of a clock generating unit and a data selecting circuit of the reference signal generating circuit according to the first embodiment of the present invention.

FIG. 2 illustrates exemplary constitutions of the clock generating unit 10 and the data selecting circuit 13. The clock generating unit 10 includes a delay section 20 and a delay control unit 21. The delay section 20 is constituted such that a plurality (9 stages) of delay units DU[0] to DU[8], each of which delays an input signal and outputs a delayed signal, are connected, and delays a start pulse (=StartP) input to the delay unit DU[0] of the first stage through the respective delay units and outputs the delayed pulses as the clock signals DUO[0] to DUO[8]. Each of the delay units DU[0] to DU[8] is constituted by a NAND circuit which is an inverting element. An output of the delay unit DU[8] of the last stage is connected to an input terminal of the delay unit DU[0] of the first stage, and the delay units DU[0] to DU[8] are connected in the form of a ring to constitute an annular delay circuit. The delay control unit 21 is constituted by variable current sources that control a delay time by which the delay units DU[0] to DU[8] delay a signal. A current value of the variable current source is controlled by changing a bias voltage Vbias.

In this example, an annular delay circuit constituted by so-called "symmetric oscillation circuit" constituted by an odd number of delay units is used. However, as in the symmetric oscillation circuit, the annular delay circuit itself is constituted by an odd number of delay units as well and so-called "asymmetric oscillation circuit" in which the outputs are equivalently even (particularly, power-of-two) may be used. Alternatively, a so-called "fully differential oscillation circuit" constituted such that an annular delay circuit may be constituted by an even number (particularly, a power of 2) of delay units, and each output of a last stage of a fully differential inverting circuit constituting a delay unit is fed back to the opposite side of the inputs of a first stage may be used. Furthermore, the clock generating unit 10 need not necessarily be the annular delay circuit. The delay control unit 21 is not limited to this constitution either.

The data selecting circuit 13 generates the low-order selection signals SCAN[0] to SCAN[17], each of which has a predetermined logic at a predetermined timing by performing a logical operation on the clock signals DUO[0] to DUO[8] output from the delay units DU[0] to DU[8] of the clock generating unit 10, and outputs the low-order selection signals SCAN[0] to SCAN[17]. The data selecting circuit 13 includes a dividing unit 22 and an output unit 23.

The dividing unit 22 is constituted by dividing circuits C[0] to C[8] that divide the clock signals DUO[0] to DUO[8] (into two in this example) based on rising edges of the clock signals DUO[0] to DUO[8] from the clock generating unit 10. The output unit 23 is constituted by a NAND circuit and an inverter circuit, and performs a predetermined logical operation on clock signals (CO[0] to CO[8]) output from respective output terminals O of the dividing circuits C[0] to C[8] of the dividing unit 22, and generates and outputs the low-order selection signals SCAN[0] to SCAN[17]. The NAND circuit performs a NAND operation on signals input to two input terminals thereof, and outputs a resultant signal.

Some signals input to the NAND circuit are inverted and then input to the NAND circuit. In FIG. 2, when a circle is attached to an input terminal of the NAND circuit, a signal is inverted and then input to the NAND circuit. Signals output from the NAND circuits are inverted by the inverter circuits in order to obtain a predetermined logic and then output as the low-order selection signals SCAN[0] to SCAN[17]. For example, a NAND operation of a clock signal output from the dividing circuit C[0] and a signal obtained by inverting a clock signal output from the dividing circuit C[7] is performed by the NAND circuit, and the result is inverted by the inverter circuit and then output as the low-order selection signal SCAN[12].

Figure 3:
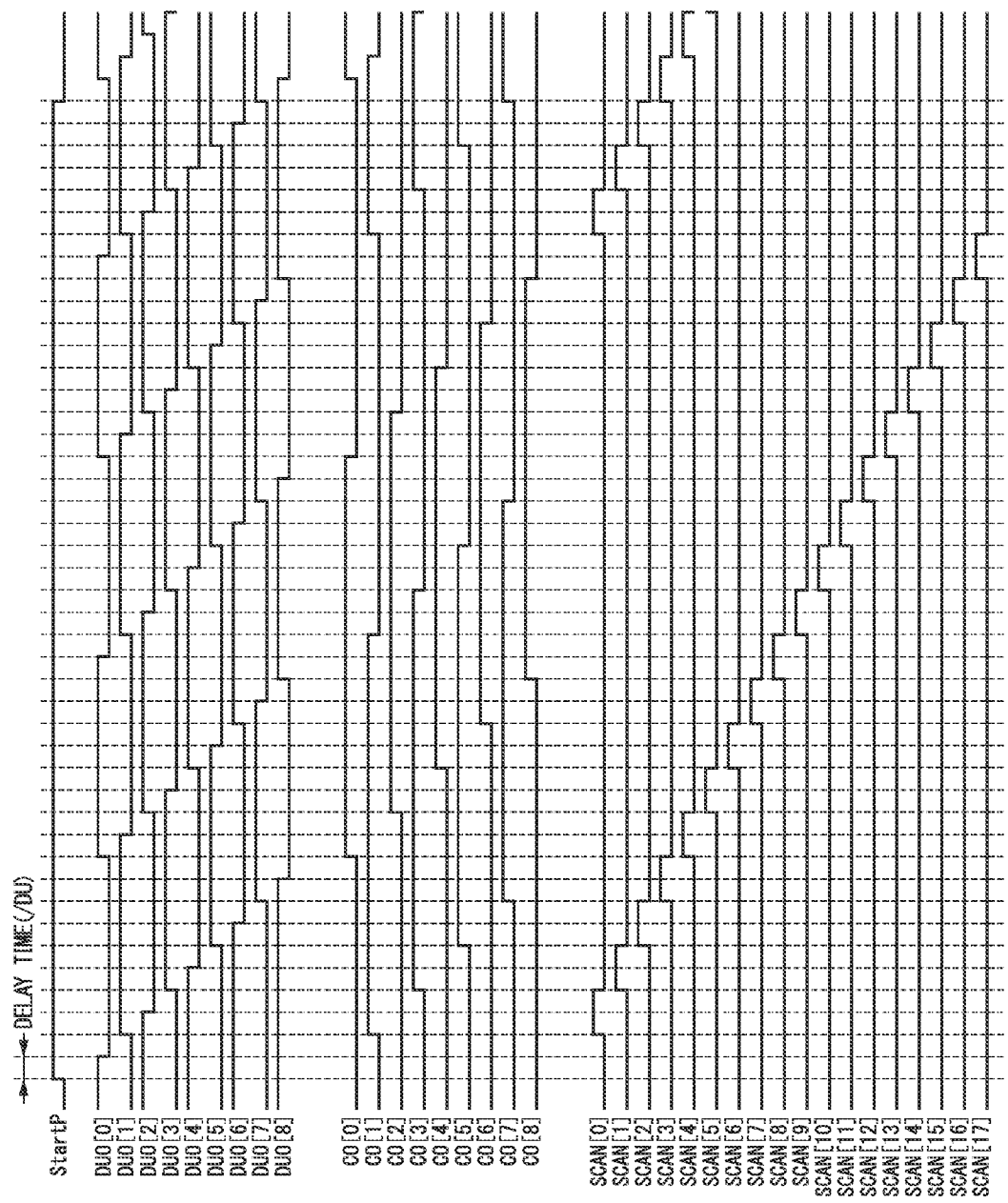
FIG. 3 is a timing chart illustrating operations of a clock generating unit and a data selecting circuit of the reference signal generating circuit according to the first embodiment of the present invention.

Next, operations of the clock generating unit 10 and the data selecting circuit 13 will be described. FIG. 3 illustrates operations of the clock generating unit 10 and the data selecting circuit 13. FIG. 3 illustrates waveforms of the start pulse StartP input to the delay unit DU[0], the clock signals DUO [0] to DUO[8] output from the delay units DU[0] to DU[8], the clock signals CO[0] to CO[8] output from the dividing circuits C[0] to C[8], and the low-order selection signals SCAN[0] to SCAN[17] output from the data selecting circuit 13 in the described order. In FIG. 3, a vertical direction represents signal voltage, and a horizontal direction represents time.

When the logical state of the start pulse StartP input to the delay unit DU[0] of the first stage changes from an L (low) state to an H (high) state, the delay units DU[0] to DU[8] start a transition operation. At a timing at which the delay time of the delay unit DU[0] elapses after the logical state of the start pulse StartP is changed, the logical state of the clock signal DUO[0] output from the delay unit DU[0] changes from the H state to the L state. Then, at a timing at which the delay time of the delay unit DU[1] elapses after the logical state of the clock signal DUO[0] is changed, the logical state of the clock signal DUO[1] output from the delay unit DU[1] changes from the L state to the H state. Thereafter, the logical states of the clock signals output from the respective delay units sequentially change in a similar manner.

Through the above-described operation, the logical states of the clock signals DUO[0] to DUO[8] output from the delay units DU[0] to DU[8] change at a timing at which a delay time of a delay unit elapses after a timing at which a logical state of a clock signal output from a delay unit of a previous stage is changed. In other words, timings at which the logical states of the respective clock signals DUO[0] to DUO[8] output from the clock generating unit 10 change differ by respective delay times of the respective delay units DU[0] to DU[8].

The dividing circuits C[0] to C[8] of the dividing unit 22 divide the clock signals DUO[0] to DUO[8] based on the rising edges of the clock signals DUO[0] to DUO[8], and output the divided clock signals CO[0] to CO[8].

The clock signals CO[0] to CO[8] are signals whose periods are as twice as long as the clock signals DUO[0] to DUO[8].

The output unit 23 performs a predetermined logical operation on the clock signals CO[0] to CO[8] output from the dividing unit 22, and outputs the low-order selection signals SCAN[0] to SCAN[17]. The low-order selection signals SCAN[0] to SCAN[17] are pulse signals that rise at timings of the rising edges of the clock signals DUO[0] to DUO[8].

As illustrated in FIG. 3, the low-order selection signal SCAN[0] rises at a timing of the rising edge of the clock signal DUO[1], and then the low-order selection signal SCAN[1] rises at a timing of the rising edge of the clock signal DUO[3]. Thereafter, similarly, the low-order selection signals SCAN[2] to SCAN[17] sequentially rise.

A period of time from timings of the rising edges of the low-order selection signals SCAN[0] to SCAN[17] to timings of next rising edges, that is, a period at which pulses of the low-order selection signals SCAN[0] to SCAN[17] are generated, is equal to a period of the clock signals CO[0] to CO[8]. Furthermore, all the low-order selection signals SCAN[0] to SCAN[17] are generated within a period of time of one cycle of the clock signals CO[0] to CO[8].

Figure 4:
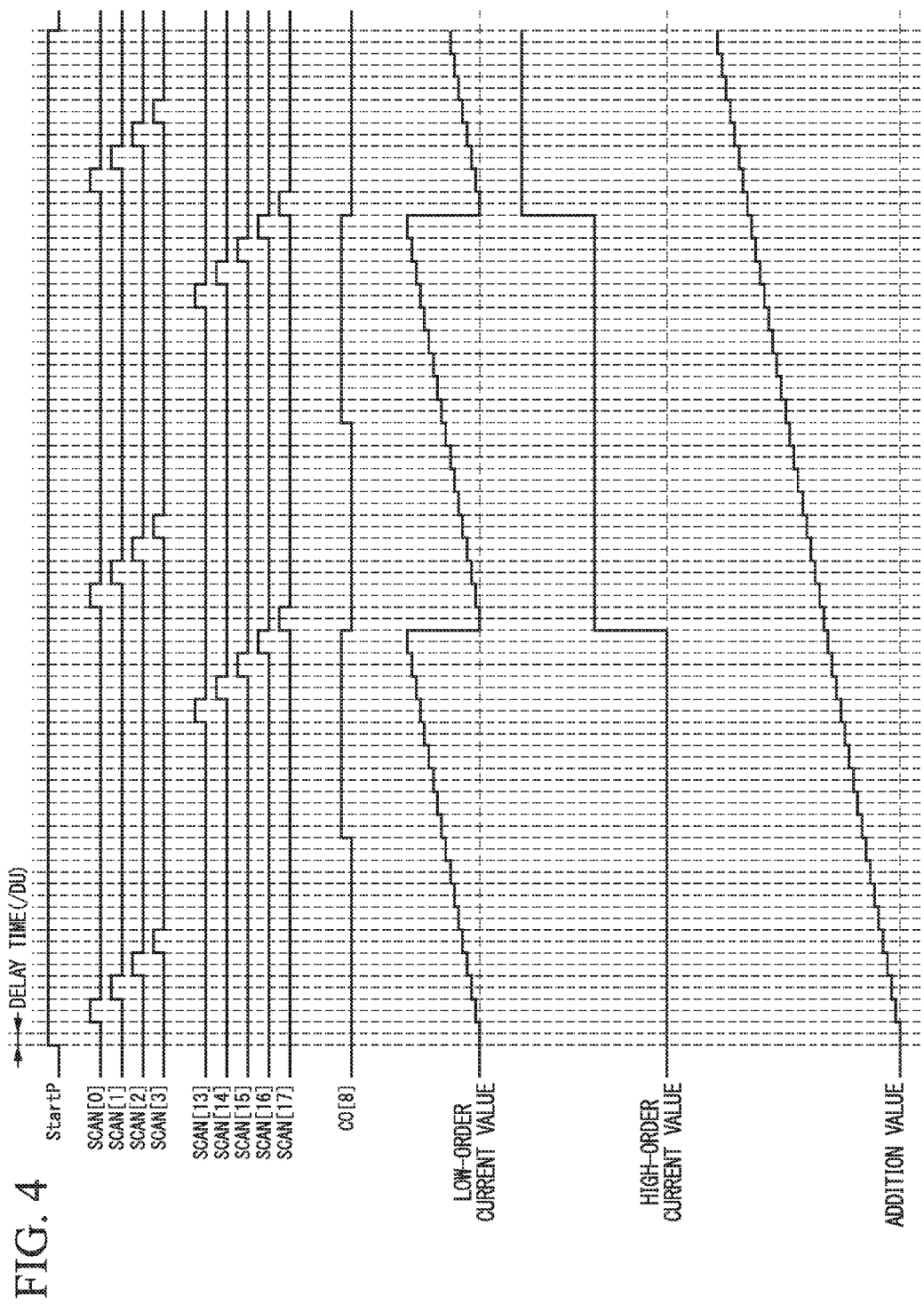
FIG. 4 is a timing chart illustrating an operation of the reference signal generating circuit according to the first embodiment of the present invention.

Next, an operation of generating a reference signal through the reference signal generating circuit according to the present embodiment will be described. FIG. 4 illustrates an operation of the reference signal generating circuit according to the present embodiment. FIG. 4 illustrates waveforms of the start pulse StartP input to the delay unit DU[0], the low-order selection signals SCAN[0] to SCAN[17] output from the data selecting circuit 13, the clock signal CO[8] output from the dividing circuit C[8], the low-order current value generated by the low-order current source cell unit 12, the high-order current value generated by the high-order current source cell unit 11, and the addition value which is the sum of the low-order current value and the high-order current value in the described order. In FIG. 4, a vertical direction represents signal voltage or a current value, and a horizontal direction represents time.

When the logical state of the start pulse StartP changes from the L state to the H state, the clock signals CO[0] to CO[8] and the low-order selection signals SCAN[0] to SCAN [17] start to be generated. At timings of the rising edges of the low-order selection signals SCAN[0] to SCAN[16], the low-order current source cells of the low-order current source cell unit 12 are selected, and low-order current values corresponding to the selected low-order current source cells are output. At a timing of the falling edge of the clock signal CO[8] input to the high-order bit control unit 14, the high-order current source cells of the high-order current source cell unit 11 are selected, and high-order current values corresponding to the selected high-order current source cells are output.

More specifically, at a timing at which the low-order selection signal SCAN[0] changes from the L state to the H state, the low-order current source cell (a cell indicated by "×1/18" in FIG. 1) to which the low-order selection signal SCAN[0] is input is selected, and an electric current is output. At this time, the low-order current value and the addition value are I/18. Thereafter, at a timing at which the low-order selection signal SCAN[0] changes from the H state to the L state, the low-order current source cell (a cell indicated by "×1/18" in FIG. 1) to which the low-order selection signal SCAN[0] is input is not selected. At the same time, the low-order selection signal SCAN[1] changes from the L state to the H state, the low-order current source cell (a cell indicated by "×2/18" in FIG. 1) to which the low-order selection signal SCAN[1] is input is selected, and an electric current is output. As a result, the low-order current value and the addition value increase to 2×I/18. As this operation is repeated, the corresponding low-order current source cell is selected, and the low-order current value and the addition value increase by I/18.

At a timing at which the low-order selection signal SCAN[16] changes from the H state to the L state, the low-order current source cell (a cell indicated by "×17/18" in FIG. 1) to which the low-order selection signal SCAN[16] is input is not selected.

As a result, the low-order current value changes from 17×I/18 to 0. At the same time, the clock signal CO[8] changes from the H state to the L state, and the shift control unit 19 generates a shift clock and outputs the generated shift clock to the shift register unit 18. Through this shift clock, the shift register unit 18 shifts by one step, the corresponding high-order current source cell is selected, the high-order current value increases by I, and the addition value becomes I. Thereafter, the above-described operation is repeated.

The constant current from the low-order current source cell unit 12 is added to the constant current from the high-order current source cell unit 11 through the adding unit 15, and the addition result is converted into a voltage through the converting unit 16 and then output as a reference signal.

In the present embodiment, when a reference signal having a voltage value with the accuracy corresponding to 12 bits is generated in response to AD conversion of 12 bits, a low-order current source cell unit including 17 low-order current source cells that output current values of I/18, 2×I/18, 3×I/18, . . . , and 17×I/18 and a high-order current source cell unit including 255 ($2^8-1$) high-order current source cells, each of which outputs the current value I, may be disposed. Thus, the low-order current source cell unit can generate 18 (corresponding to $2^4$) current values 0 to 17×I/18, and the high-order current source cell unit can generate 256 ($2^8$) current values 0 to ($2^8-1$)×I. Thus, the accuracy of a current value obtained by adding the current value generated by the low-order current source cell unit to the current value generated by the high-order current source cell unit corresponds to 12 bits. In this case, the reference signal generating circuit according to the present embodiment includes a total of 272 current source cells as the low-order current source cells and the high-order current source cells.

Figure 10:
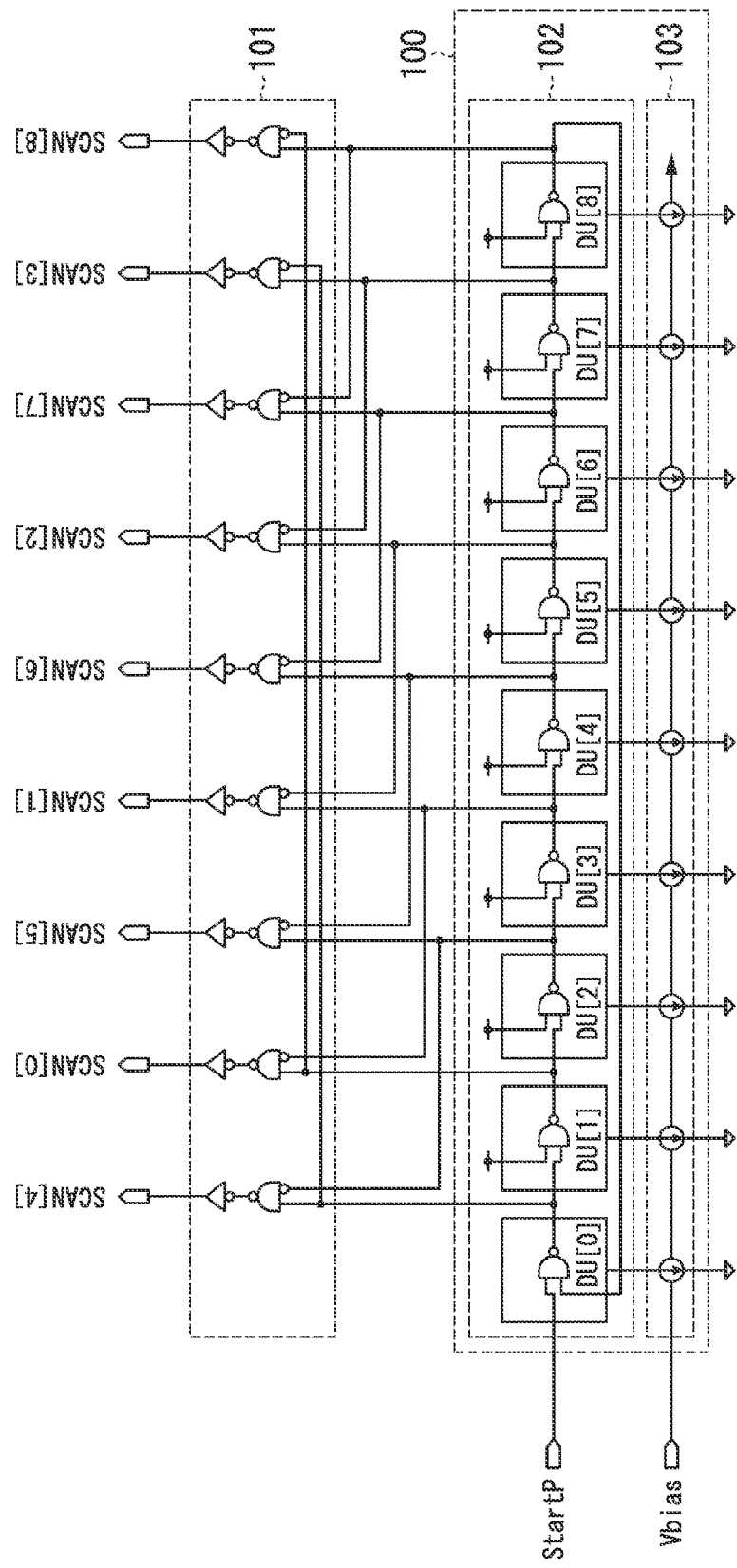
FIG. 10 is a circuit diagram illustrating constitutions of a clock generating unit and a data selecting circuit according to the related art.

Next, in order to compare the number of current source cells according to the present embodiment with the number of current source cells according to a related art, a constitution and an operation of a clock generating unit and a data selecting circuit according to a related art will be described. FIG. 10 illustrates constitutions of a clock generating unit and a data selecting circuit disclosed in Japanese Unexamined Patent Application, First Publication No. 2011-250009. A circuit illustrated in FIG. 10 includes a clock generating unit 100 and a data selecting circuit 101.

The clock generating unit 100 includes a delay section 102 and a delay control unit 103.

The constitutions of the delay section 102 and the delay control unit 103 are similar to the constitutions of the delay section 20 and the delay control unit 21 illustrated in FIG. 1. The data selecting circuit 101 is constituted by NAND circuits and inverter circuits, and performs a logical operation on clock signals output from the delay units DU[0] to DU[8], and generates and outputs the low-order selection signals SCAN[0] to SCAN[8], each of which has a predetermined logic at a predetermined timing.

Figure 11:
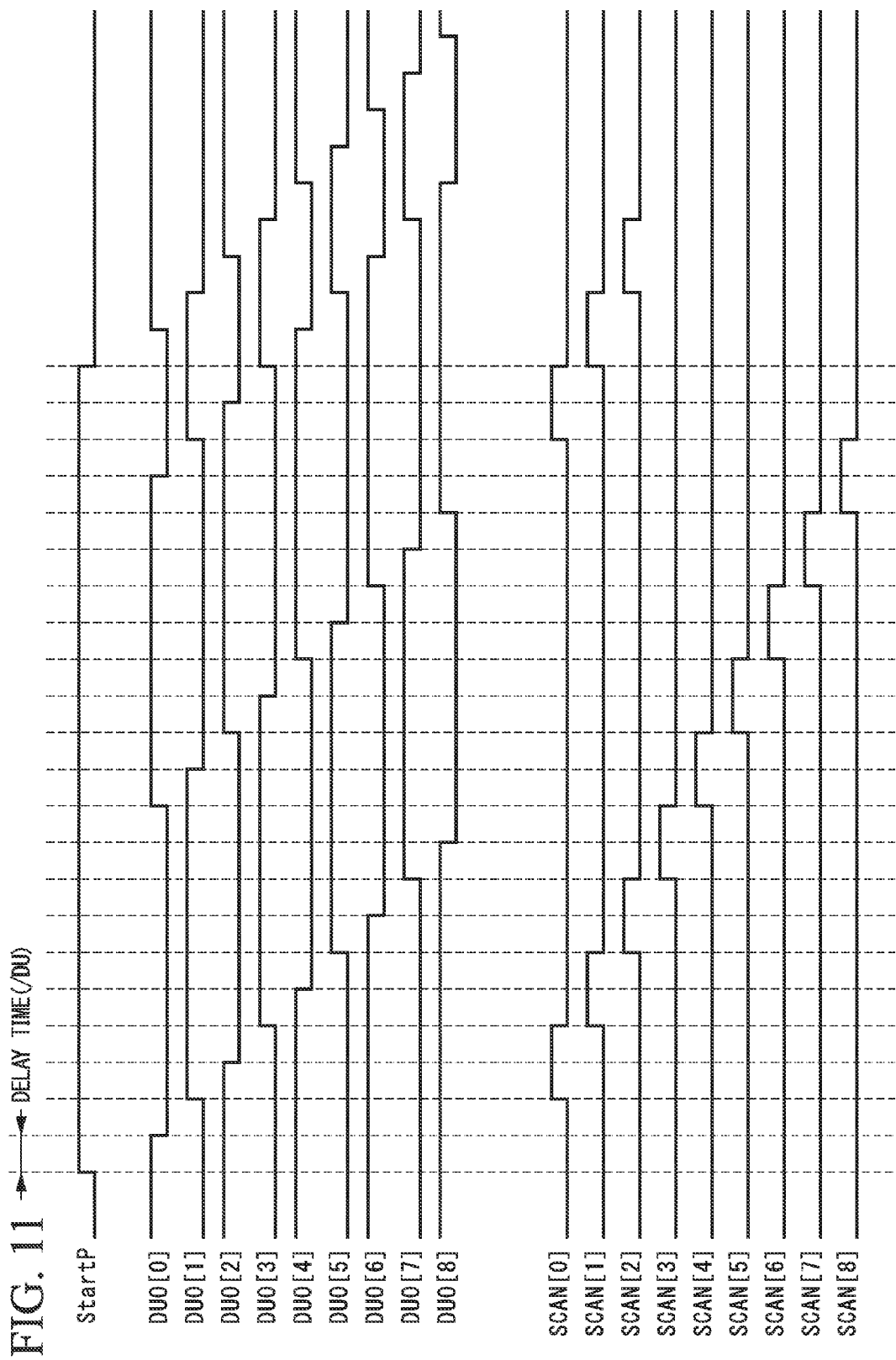
FIG. 11 is a timing chart illustrating operations of the clock generating unit and the data selecting circuit according to the related art.

FIG. 11 illustrates an operation of the data selecting circuit 101 illustrated in FIG. 10. FIG. 11 illustrates waveforms of the start pulse StartP input to the delay unit DU[0], the clock signals DUO[0] to DUO[8] output from the delay units DU[0] to DU[8], and the low-order selection signals SCAN[0] to SCAN[8] output from the data selecting circuit 101 in the described order. In FIG. 11, a vertical direction represents signal voltage, and a horizontal direction represents time.

When the logical state of the start pulse StartP input to the delay unit DU[0] of the first stage changes from the L state to the H state, the delay units DU[0] to DU[8] start a transition operation. Thereafter, the logical states of the clock signals output from the respective delay units sequentially change in a similar manner.

The low-order selection signals SCAN[0] to SCAN[8] are pulse signals that rise at timings of rising edges of the clock signals DUO[0] to DUO[8]. As illustrated in FIG. 11, the low-order selection signal SCAN[0] rises at a timing of the rising edge of the clock signal DUO[1], and then the low-order selection signal SCAN[1] rises at a timing of the rising edge of the clock signal DUO[3]. Thereafter, similarly, the low-order selection signals SCAN[2] to SCAN[8] sequentially rise.

Figure 12:
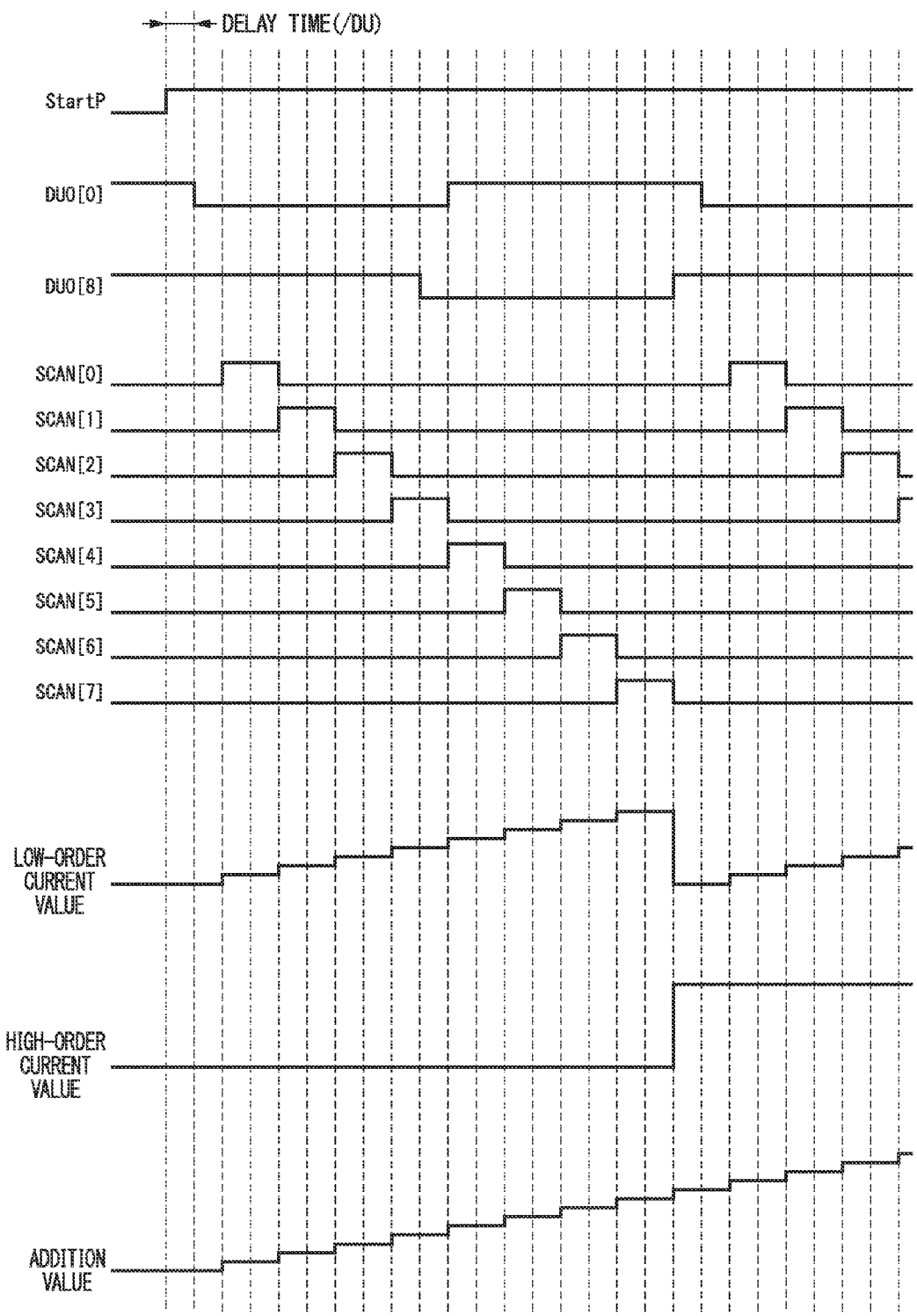
FIG. 12 is a timing chart illustrating an operation of a reference signal generating circuit according to the related art.

FIG. 12 illustrates an operation of a reference signal generating circuit employing the circuit illustrated in FIG. 10. FIG. 12 illustrates waveforms of the start pulse StartP input to the delay unit DU[0] and the low-order selection signals SCAN[0] to SCAN[7] output from the data selecting circuit 101, the low-order current value generated by the low-order current source cell unit, the high-order current value generated by the high-order current source cell unit, and the addition value which is the sum of the low-order current value and the high-order current value in the described order. In FIG. 12, a vertical direction represents signal voltage or a current value, and a horizontal direction represents time.

At timings of the rising edges of the low-order selection signals SCAN[0] to SCAN[8], the low-order current source cells of the low-order current source cell unit are selected, and low-order current values corresponding to the selected low-order current source cells are output. Furthermore, at a timing of the rising edge of the clock signal DUO[8], the high-order current source cell of the high-order current source cell unit is selected, and a high-order current value corresponding to the selected high-order current source cell is output.

More specifically, at a timing at which the low-order selection signal SCAN[0] changes from the L state to the H state, the low-order current source cell (a cell generating a current value which is a ninth (⅑) of the current value generated by the high-order current source cell) to which the low-order selection signal SCAN[0] is input is selected and an electric current is output. At this time, the low-order current value and the addition value are I/9. Thereafter, at a timing at which the low-order selection signal SCAN[0] changes from the H state to the L state, the low-order current source cell (a cell generating a current value which is a ninth (⅑) of the current value generated by the high-order current source cell) to which the low-order selection signal SCAN[0] is input is not selected. At the same time, the low-order selection signal SCAN[1] changes from the L state to the H state, and the low-order current source cell (a cell generating a current value which is two ninths (⅔) of the current value generated by the high-order current source cell) to which the low-order selection signal SCAN[1] is selected and an electric current is output. As a result, the low-order current value and the addition value increase to 2×I/9. As this operation is repeated, the corresponding low-order current source cell is selected, and the low-order current value and the addition value increase by I/9.

At a timing at which the low-order selection signal SCAN [7] changes from the H state to the L state, the low-order current source cell (a cell generating a current value which is eight ninths (%) of the current value generated by the high-order current source cell) to which the low-order selection signal SCAN[7] is input is not selected. As a result, the low-order current value changes from 8×I/9 to 0. At the same time, the clock signal DUO[8] changes from the L state to the H state. At this timing, the high-order current source cell is selected, the high-order current value increases by I, and the addition value becomes I. Thereafter, the above-described operation is repeated.

In the reference signal generating circuit employing the circuit illustrated in FIG. 10, when a reference signal having a voltage with the accuracy corresponding to 12 bits is generated in response to AD conversion of 12 bits, a low-order current source cell unit including 8 low-order current source cells that output current values of I'/9, 2×I'/9, 3=I'/9, . . . , and 8=I'/9 and a high-order current source cell unit including 511 ($2^9-1$) high-order current source cells that output current values I' may be disposed. Thus, the low-order current source cell unit can generate 9 (corresponding to $2^3$) current values of 0 to 8×I'/9, and the high-order current source cell unit can generate 512 ($2^9$) current values of 0 to ($2^9-1$)×I'. Thus, the accuracy of a current value obtained by adding the current value generated by the low-order current source cell unit to the current value generated by the high-order current source cell unit corresponds to 12 bits. In this case, the reference signal generating circuit includes a total of 519 current source cells as the low-order current source cells and the high-order current source cells.

As described above, in the reference signal generating circuit according to the present embodiment, when a reference signal having a voltage value with the accuracy corresponding to 12 bits is generated in response to AD conversion of 12 bits, 17 low-order current source cells and 255 high-order current source cells are arranged, and thus a total of 272 current source cells are arranged as the low-order current source cells and the high-order current source cells. Thus, the number of high-order current source cells can be reduced, and as a result, a total of the number of low-order current source cells of the low-order current source cell unit and the number of high-order current source cells of the high-order current source cell unit can be reduced.

In the reference signal generating circuit according to the present embodiment, the high-order current source cells are selected at time intervals of a period (which is twice as long as a period of the clock signal DUO[8]) of the clock signal CO[8] obtained by dividing the clock signal DUO[8]. Meanwhile, in a reference signal generating circuit employing the circuit illustrated in FIG. 10, the high-order current source cells are selected at time intervals equal to the period of the clock signal DUO[8]. As described above, in the reference signal generating circuit according to the present embodiment, the frequency at which the high-order current source cells are selected within a predetermined period of time is one half (½). Thus, in the reference signal generating circuit according to the present embodiment, the number of high-order current source cells can be reduced.

A time interval at which the low-order current source cells are selected is the delay time of two delay units in both the operation illustrated in FIG. 4 and the operation illustrated in FIG. 12. Thus, a current value of a constant current generated by a single low-order current source cell and a single high-order current source cell is adjusted. As a result, the reference signal generating circuit according to the present embodiment can generate a current value (addition value) that changes at the same rate as a current value (addition value) generated by the reference signal generating circuit employing the circuit illustrated in FIG. 10. In other words, the reference signal generating circuit according to the present embodiment can generate a reference signal identical to the reference signal generated by the reference signal generating circuit employing the circuit illustrated in FIG. 10.

In the reference signal generating circuit according to the present embodiment, the number of low-order current source cells increases compared to the reference signal generating circuit employing the circuit illustrated in FIG. 10. However, the effect of reducing the number of high-order current source cells is large, and a total of the number of low-order current source cells and high-order current source cells can be reduced.

The low-order selection signals SCAN[0] to SCAN[17] used to select the low-order current source cells change from the L state to the H state at timings of either of the rising edges and the falling edges of the clock signals DUO[0] to DUO[8]. In the example of the present embodiment, the low-order selection signals SCAN[0] to SCAN[17] change from the L state to the H state at timings of the rising edges of the clock signals DUO[0] to DUO[8]. The reason for this will be described below.

As described above with reference to FIG. 9, in the imaging device employing the AD conversion circuit of the tdc type SS, data corresponding to a period of time during which the reference signal is compared with the analog signal is latched in the latch unit (the latch unit 1108 in FIG. 9) and the counter (the counter 1103 in FIG. 9) at a timing at which a relationship representing whether the voltage of the reference signal (the ramp wave generated by the ramp wave generating unit 1019 in FIG. 9) is higher or lower than the voltage of the analog signal (the analog signal of the vertical signal line 1013 in FIG. 9) of an AD conversion target is reversed.

Figure 9:
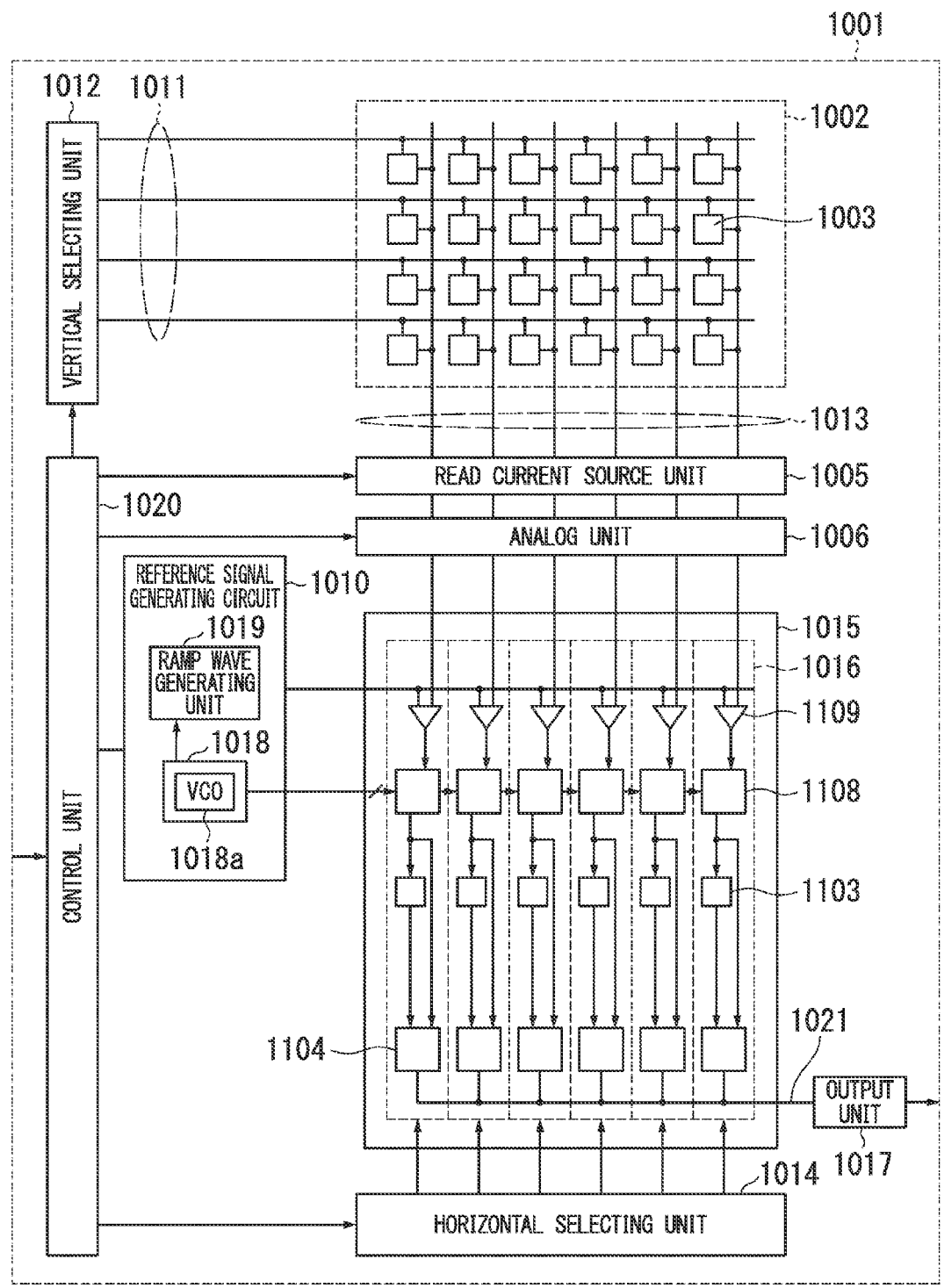
FIG. 9 is a block diagram illustrating a constitution of an imaging device according to a related art.

More specifically, the low-order phase signal (the low-order phase signal output from the clock generating unit 1018 in FIG. 9) composed of a plurality of clock signals having a phase difference therebetween is input to the latch unit, and the latch unit latches a logical state corresponding to the low-order phase signal. In the reference signal generating circuit according to the present embodiment, the clock signals DUO[0] to DUO[8] output from the delay units DU[0] to DU[8] configure the low-order phase signal. In other words, in the imaging device employing the reference signal generating circuit according to the present embodiment, the clock signals DUO[0] to DUO[8] are used for generation of the low-order selection signals SCAN[0] to SCAN[17] used to generate the reference signal, and used as the low-order phase signals latched in the latch unit.

In the latch unit, the H state or the L state is latched on each of the clock signals DUO[0] to DUO[8]. A logical state of a low-order phase signal composed of a combination of the H states (corresponding to a logical value "1") and the L states (corresponding to a logical value "0") of the respective clock signals latched in the latch unit is encoded (binarized). Thus, low-order data of data configuring an AD conversion result is obtained.

In a signal group in which a plurality of clock signals configuring the low-order phase signal latched in the latch unit are arranged in a predetermined order, there are a section in which all a plurality of consecutive clock signals are in either the H state or the L state and a section in which one of two neighboring clock signals is in the H state and the other is in the L state. An encoding (binarization) operation can be performed by detecting the position of the signal group corresponding to the section in which one of two neighboring clock signals is in the H state and the other is in the L state and outputting a binary number corresponding to the position.

In this encoding (binarization) operation, it is preferable that the latch circuit latch the clock signal at a timing at which one of a rising edge and a falling edge of an arbitrary clock signal is detected. Generally, a transition period of time (a period of time required for the clock signal to transition from the L state to the H state) of the rising edge of the clock signal does not match a transition period of time (a period of time required for the clock signal to transition from the H state to the L state) of the falling edge thereof. When a process, a voltage, or a temperature changes, a mismatch degree between the transition period of time of the rising edge and the transition period of time of the falling edge further increases.

If the latch circuit latches the clock signal at a timing at which an edge having a short transition period of time is detected, even when a latch timing is slightly deviated, a logical state different from a logical state to be originally latched is likely to be latched. When a logical state different from a logical state to be originally latched is latched, an encoding operation is erroneously performed, and an encoding error occurs. In order to suppress the encoding error, it is preferable that the latch circuit latch the clock signal at a timing at which one (an edge having a long transition period of time) of a rising edge and a falling edge of an arbitrary clock signal is detected as described above.

The latch circuit latches the low-order phase signal at a timing at which the voltage of the reference signal changes, and a relationship representing whether the voltage of the reference signal is higher or lower than the voltage of the analog signal of the AD conversion target is reversed. In other words, the latch circuit latches the low-order phase signal at an arbitrary timing at which the voltage of the reference signal changes. A timing at which the voltage of the reference signal changes is equal to a timing at which a logical state of a low-order selection signal used to select the low-order current source cell changes.

Thus, in order for the latch circuit to latch the clock signal at a timing at which one of a rising edge and a falling edge of an arbitrary clock signal is detected, it is preferable that the logical state of the low-order selection signal change at a timing at which one of a rising edge and a falling edge of an arbitrary clock signal is detected. Thus, in the reference signal generating circuit according to the present embodiment, the low-order selection signals SCAN[0] to SCAN[17] change from the L state to the H state at timings of the rising edges of the clock signals DUO[0] to DUO[8].

In the present embodiment, the low-order selection signals SCAN[0] to SCAN[17] are generated from the clock signals CO[0] to CO[8] obtained by dividing the clock signals DUO [0] to DUO[8], but the present invention is not limited to this example, and the low-order selection signals SCAN[0] to SCAN[17] may be generated directly from the clock signals DUO[0] to DUO[8]. Furthermore, in the present embodiment, the low-order selection signals SCAN[0] to SCAN[17] change from the L state to the H state at timings of the rising edges of the clock signals DUO[0] to DUO[8]. However, the AD conversion circuit is constituted such that the latch unit latches the logical state corresponding to the low-order phase signal at timings of the falling edges of the clock signals DUO[0] to DUO[8]. In this case, the low-order selection signals SCAN[0] to SCAN[17] may change from the L state to the H state at timings of the falling edges of the clock signals DUO[0] to DUO[8].

As described above, according to the present embodiment, the high-order current source cell is selected based on the clock signal CO[8] obtained by dividing the clock signal DUO[8] configuring the low-order phase signal, and the selection is a pulse generated at time intervals based on the period of the clock signal CO[8] used for selection of the high-order current source cell. The low-order current source cells are selected based on the low-order selection signals SCAN[0] to SCAN[17] composed of pulses generated at timings of the rising edges or the falling edges of the clock signals DUO[0] to DUO[8] configuring the low-order phase signal, and thus the number of high-order current source cells can be reduced.

Furthermore, according to the present embodiment, a total of the number of low-order current source cells and high-order current source cells can be reduced.

Furthermore, the low-order current source cells are selected based on the low-order selection signals SCAN[0] to SCAN[17] generated from the clock signals CO[0] to CO[8] obtained by dividing the clock signals DUO[0] to DUO[8], and thus selection of the low-order current source cell can be easily performed.

In addition, since the delay section 20 is constituted by an annular delay circuit, it is possible to cause the respective delay units to oscillate to output the clock signals having a predetermined phase difference therebetween, and control of the delay section 20 can be easily performed.

Second Embodiment

Figure 5:
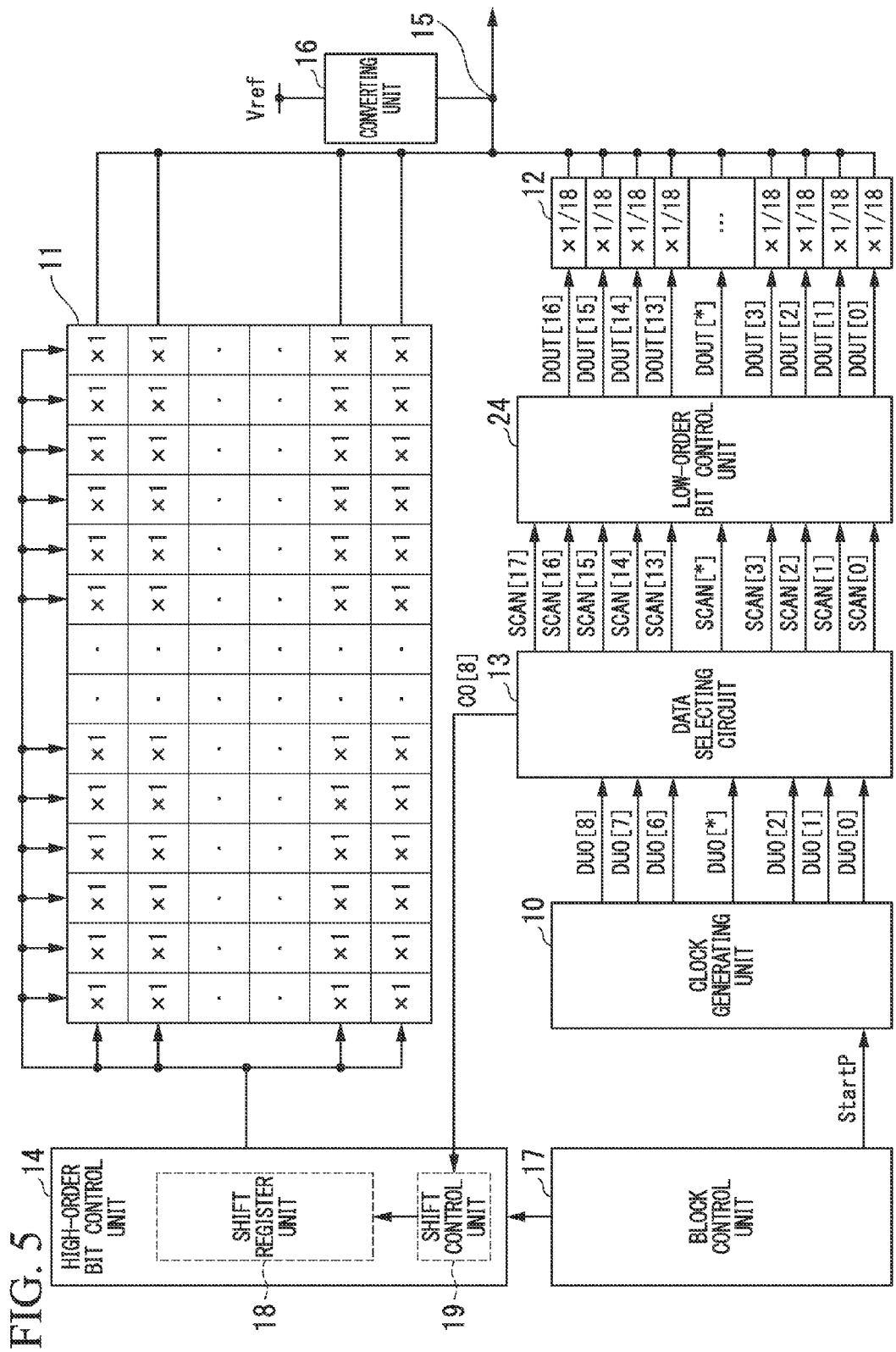
FIG. 5 is a block diagram illustrating a constitution of a reference signal generating circuit according to a second embodiment of the present invention.

Next, a second embodiment of the present invention will be described. FIG. 5 is an exemplary constitution of a reference signal generating circuit according to the present embodiment. The reference signal generating circuit illustrated in FIG. 5 includes a clock generating unit 10, a high-order current source cell unit 11, a low-order current source cell unit 12, a data selecting circuit 13, a high-order bit control unit 14, an adding unit 15, a converting unit 16, the block control unit 17, and a low-order bit control unit 24.

The reference signal generating circuit according to the present embodiment is different from the reference signal generating circuit according to the first embodiment in that a constitution of the low-order current source cell unit 12 is different, and the low-order bit control unit 24 is provided. The remaining points are the same as in the reference signal generating circuit according to the first embodiment, and thus a description thereof will be omitted.

The low-order current source cell unit 12 includes a plurality of low-order current source cells (cells indicated by "×1/18" in FIG. 5), each of which generates a current value of a predetermined proportion (an eighteenth (1/18) in the present embodiment) of a current value of a constant current generated by each of high-order current source cells constituting the high-order current source cell unit 11. In other words, when a current value of a constant current generated by a single high-order current source cell is I, each of the low-order current source cells constituting the low-order current source cell unit 12 generates an electric current having a current value of I/18.

The low-order bit control unit 24 generates low-order selection signals DOUT[0] to DOUT[16] used to select the low-order current source cells, each of which outputs an electric current from among the low-order current source cells constituting the low-order current source cell unit 12 based on the low-order selection signals SCAN[0] to SCAN [17] output from the data selecting circuit 13, and outputs the low-order selection signals DOUT[0] to DOUT[16] to the low-order current source cell unit 12. The 17 low-order current source cells constituting the low-order current source cell unit 12 are selected according to the low-order selection signals DOUT[0] to DOUT[16], respectively. Furthermore, when the low-order selection signal SCAN[17] enters an active state (high state), selection of the 17 low-order current source cells constituting the low-order current source cell unit 12 is released, and the current value output from the low-order current source cell unit 12 becomes zero (0).

Figure 6:
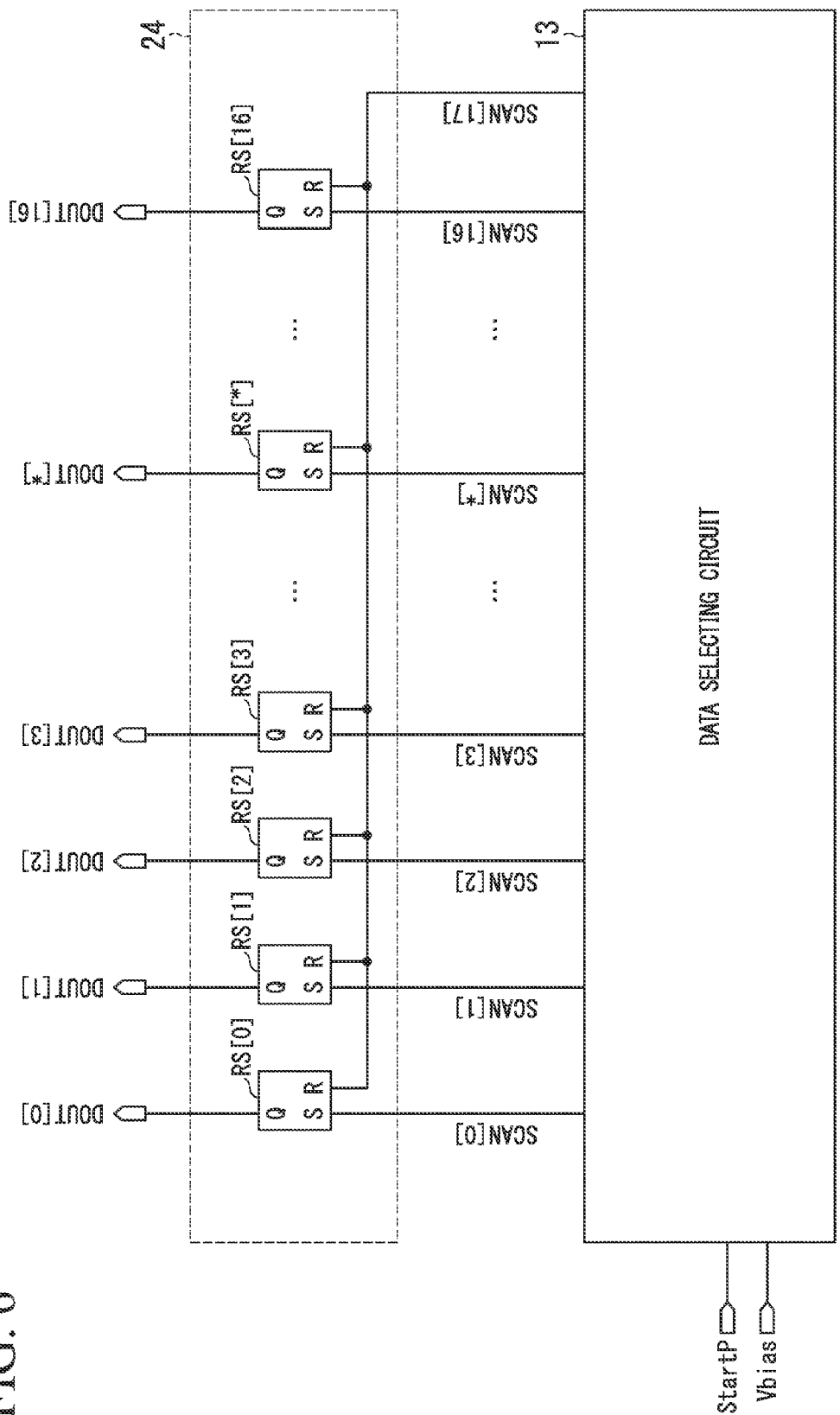
FIG. 6 is a circuit diagram illustrating a constitution of a low-order bit control unit of the reference signal generating circuit according to the second embodiment of the present invention.

FIG. 6 illustrates an exemplary constitution of the low-order bit control unit 24. As illustrated in FIG. 6, the low-order bit control unit 24 includes RS latch circuits RS[0] to RS[16]. The low-order selection signals SCAN[0] to SCAN[16] output from the data selecting circuit 13 are input to S terminals of the RS latch circuits RS[0] to RS[16], and the low-order selection signal SCAN[17] output from the data selecting circuit 13 is input to R terminals of the RS latch circuits RS[0] to RS[16].

Figure 7:
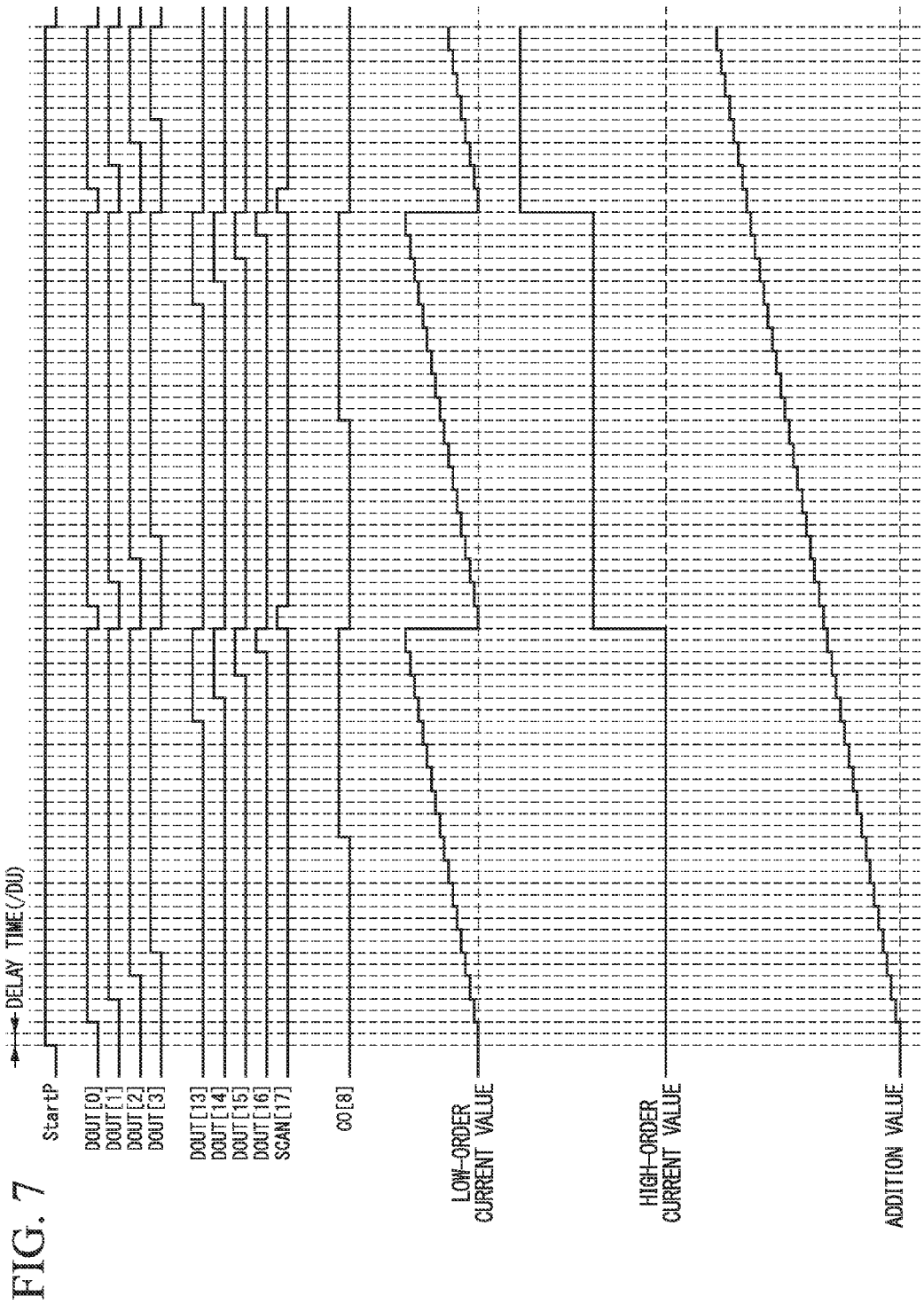
FIG. 7 is a timing chart illustrating an operation of the reference signal generating circuit according to the second embodiment of the present invention.

Next, an operation of generating a reference signal through the reference signal generating circuit according to the present embodiment will be described. FIG. 7 illustrates an operation of the reference signal generating circuit according to the present embodiment. FIG. 7 illustrates waveforms of the start pulse StartP input to the delay unit DU[0], the low-order selection signals DOUT[0] to DOUT[16] output from the low-order bit control unit 24, the low-order selection signal SCAN[17] output from the data selecting circuit 13, the clock signal CO[8] output from the dividing circuit C[8], the low-order current value generated by the low-order current source cell unit 12, the high-order current value generated by the high-order current source cell unit 11, and the addition value which is the sum of the low-order current value and the high-order current value in the described order. In FIG. 7, a vertical direction represents signal voltage or a current value, and a horizontal direction represents time.

When the logical state of the start pulse StartP changes from the L state to the H state, the clock signals CO[0] to CO[8], the low-order selection signals SCAN[0] to SCAN[17], and the low-order selection signals DOUT[0] to DOUT[16] start to be generated. At timings of the rising edges of the low-order selection signals DOUT[0] to DOUT[16], the low-order current source cells of the low-order current source cell unit 12 are selected, and low-order current values according to the selected low-order current source cells are output. Furthermore, at a timing of the falling edge of the clock signal CO[8] input to the high-order bit control unit 14, the high-order current source cells of the high-order current source cell unit 11 are selected, and high-order current values according to the selected high-order current source cells are output.

More specifically, at a timing at which the low-order selection signal DOUT[0] changes from the L state to the H state, the low-order current source cell to which the low-order selection signal DOUT[0] is input is selected, and an electric current is output. At this time, the low-order current value and the addition value are I/18. Thereafter, at a timing at which the low-order selection signal DOUT[1] changes from the L state to the H state, the low-order current source cell to which the low-order selection signal DOUT[1] is input is selected, and an electric current is output. As a result, the low-order current value and the addition value increase to 2×I/18. As this operation is repeated, the corresponding low-order current source cell is selected, and the low-order current value and the addition value increase by I/18.

At a timing at which the low-order selection signal SCAN[17] changes from the L state to the H state, the low-order selection signals DOUT[0] to DOUT[16] change from the H state to the L state, selection of all the low-order current source cells is released, and the low-order current value changes from 17×I/18 to 0. At the same time, the clock signal CO[8] changes from the H state to the L state, and the shift control unit 19 generates a shift clock, and outputs the shift clock to the shift register unit 18. Through the shift clock, the shift register unit 18 shifts by one step, the corresponding high-order current source cell is selected, the high-order current value increases by I, and the addition value becomes I. Thereafter, the above-described operation is repeated.

The constant current from the low-order current source cell unit 12 is added to the constant current from the high-order current source cell unit 11 through the adding unit 15, and the addition result is converted into a voltage through the converting unit 16 and then output as a reference signal.

In the present embodiment, when a reference signal having a voltage value with the accuracy corresponding to 12 bits is generated in response to AD conversion of 12 bits, a low-order current source cell unit including 17 low-order current source cells, each of which outputs a current value of I/18, and a high-order current source cell unit including 255 ($2^8-1$) high-order current source cells, each of which outputs the current value I, may be disposed. Thus, the low-order current source cell unit can generate 18 (corresponding to $2^4$) current values 0 to 17×I/18, and the high-order current source cell unit can generate 256 ($2^8$) current values 0 to ($2^8-1$)×I. Thus, the accuracy of a current value obtained by adding the current value generated by the low-order current source cell unit to the current value generated by the high-order current source cell unit corresponds to 12 bits. In this case, the reference signal generating circuit according to the present embodiment includes a total of 272 current source cells as the low-order current source cells and the high-order current source cells.

On the other hand, the reference signal generating circuit employing the data selecting circuit generates a reference signal having a voltage value with the accuracy corresponding to 12 bits in response to AD conversion of 12 bits. In this case, as described above, a low-order current source cell unit including 8 low-order current source cells and a high-order current source cell unit including 511 ($2^9-1$) high-order current source cells may be disposed. In this case, the reference signal generating circuit according to the present embodiment includes a total of 519 current source cells as the low-order current source cells and the high-order current source cells.

Thus, in the reference signal generating circuit according to the present embodiment, the number of high-order current source cells can be reduced, and as a result, a total of the number of low-order current source cells of the low-order current source cell unit and the number of high-order current source cells of the high-order current source cell unit can be reduced.

In the present embodiment, the low-order selection signals SCAN[0] to SCAN[17] used to generate the low-order selection signals DOUT[0] to DOUT[16] are generated from the clock signals CO[0] to CO[8] obtained by dividing the clock signals DUO[0] to DUO[8]. However, the present invention is not limited to this example, and the low-order selection signals SCAN[0] to SCAN[17] may be generated directly from the clock signals DUO[0] to DUO[8]. Furthermore, in the present embodiment, the low-order selection signals DOUT[0] to DOUT[16] change from the L state to the H state at timings of the rising edges of the clock signals DUO[0] to DUO[8]. However, the AD conversion circuit is constituted such that the latch unit latches the logical state corresponding to the low-order phase signal at timings of the falling edges of the clock signals DUO[0] to DUO[8]. In this case, the low-order selection signals DOUT[0] to DOUT[16] may change from the L state to the H state at timings of the falling edges of the clock signals DUO[0] to DUO[8].

As described above, according to the present embodiment, the high-order current source cell is selected based on the clock signal CO[8] obtained by dividing the clock signal DUO[8] configuring the low-order phase signal, and the selection is a pulse generated at time intervals based on the period of the clock signal CO[8] used for selection of the high-order current source cell. The low-order current source cells are selected based on the low-order selection signals DOUT[0] to DOUT[16] composed of pulses generated at timings of the rising edges or the falling edges of the clock signals DUO[0] to DUO[8] configuring the low-order phase signal, and thus the number of high-order current source cells can be reduced.

Furthermore, according to the present embodiment, a total of the number of low-order current source cells and high-order current source cells can be reduced.

Furthermore, the low-order current source cells are selected based on the low-order selection signals DOUT[0] to DOUT[16] generated from the clock signals CO[0] to CO[8] obtained by dividing the clock signals DUO[0] to DUO[8]. Thus, selection of the low-order current source cell can be easily performed.

In addition, since the delay section 20 is constituted by an annular delay circuit, it is possible to cause the respective delay units to oscillate to output the clock signals having a predetermined phase difference therebetween, and control of the delay section 20 can be easily performed.

Third Embodiment

Figure 8:
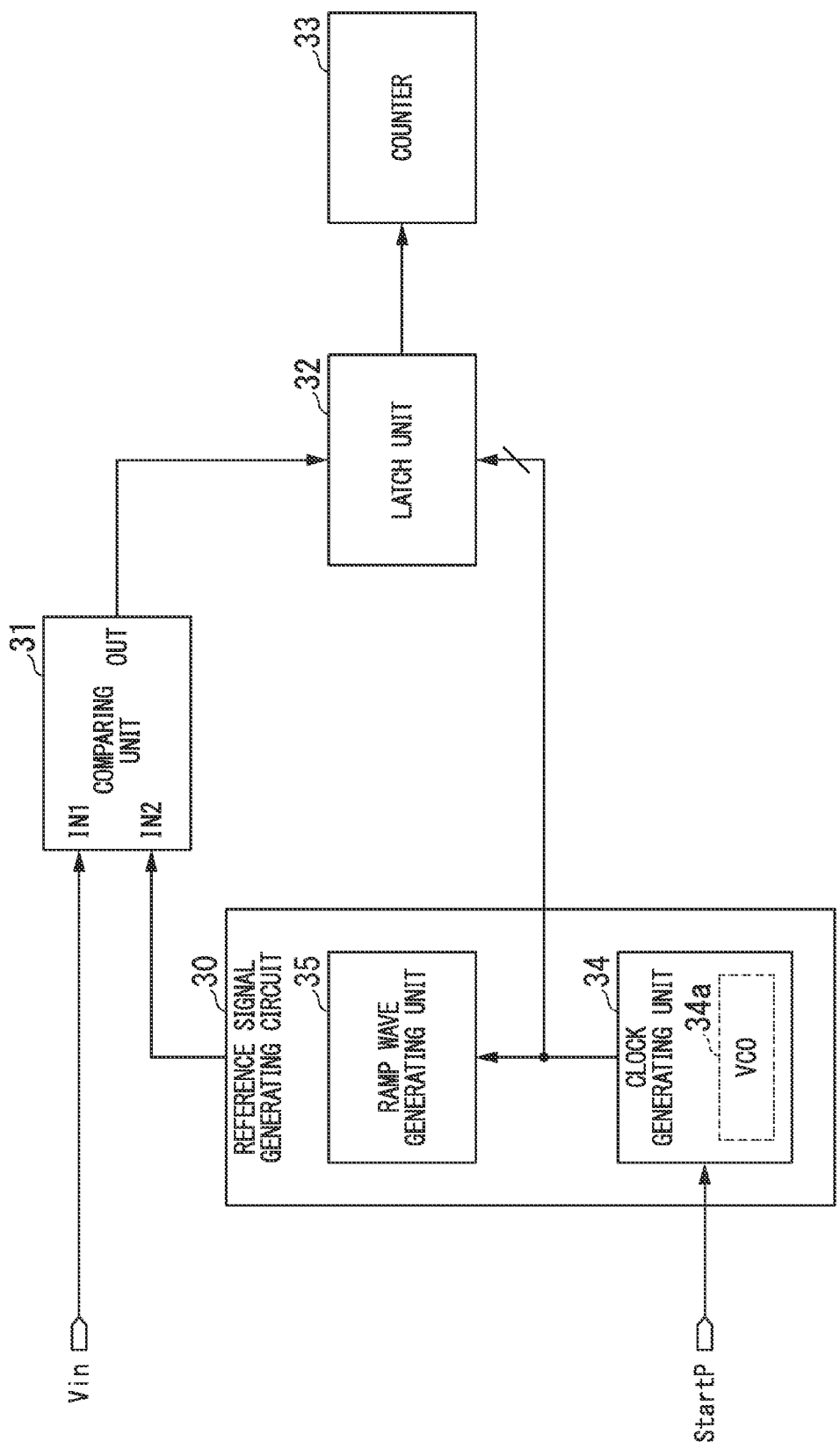
FIG. 8 is a block diagram illustrating a constitution of an AD conversion circuit according to a third embodiment of the present invention.

Next, a third embodiment of the present invention will be described. FIG. 8 illustrates an exemplary constitution of an AD conversion circuit according to the present embodiment. The AD conversion circuit illustrated in FIG. 8 includes a reference signal generating circuit 30, a comparing unit 31, a latch unit 32, and a counter 33.

The reference signal generating circuit 30 includes a clock generating unit 34 and a ramp wave generating unit 35, and generates a ramp wave as a reference signal whose voltage value increases or decreases with the passage of time. The clock generating unit 34 includes a VCO 34a which is an annular delay circuit including n (n is a natural number of 2 or more) delay units, and generates a clock signal used to drive the ramp wave generating unit 35 based on the start pulse StartP. The ramp wave generating unit 35 generates the ramp wave based on the clock signal applied from the clock generating unit 34.

The comparing unit 31 includes a first input terminal Ni to which an analog signal Vin serving as an AD conversion target is input, a second input terminal IN2 to which the ramp wave is input from the reference signal generating circuit 30, and an output terminal OUT that outputs a comparison result of the analog signal Vin and the ramp wave, and compares the analog signal Vin with the ramp wave. The latch unit 32 latches the low-order phase signal received from the clock generating unit 34. The counter 33 counts a clock as a count clock based on the low-order phase signal received from the clock generating unit 34, and obtains a count value (high-order count value).

The reference signal generating circuit 30 in the AD conversion circuit according to the present embodiment is the same as the reference signal generating circuit according to the first embodiment or the second embodiment. The clock generating unit 34 in the reference signal generating circuit 30 corresponds to the clock generating unit 10 illustrated in FIG. 1 or FIG. 5. The ramp wave generating unit 35 in the reference signal generating circuit 30 corresponds to the high-order current source cell unit 11, the low-order current source cell unit 12, the data selecting circuit 13, the high-order bit control unit 14, the adding unit 15, the converting unit 16, and the low-order bit control unit 24 illustrated in FIG. 1 or FIG. 5. The block control unit 17 illustrated in FIG. 1 or FIG. 5 is not illustrated in FIG. 8.

Next, an operation of the present example will be described. First of all, the analog signal Vin serving as an AD conversion target is input to the comparing unit 31. After the analog signal Vin is stabilized, the logical state of the start pulse StartP changes from the L state to the H state, and thus the VCO 34a starts to generate the clock signal. At the same time as the VCO 34a starts to generate the clock signal, the counter 33 starts a count operation, and the reference signal generating circuit 30 starts to generate the ramp wave.

Furthermore, the comparing unit 31 starts to compare the analog signal Vin with the ramp wave. In parallel with this operation, the low-order phase signal is input from the VCO 34a to the latch unit 32, and one of the clock signals configuring the low-order phase signal is input to the counter 33 through the latch unit 32. When the magnitude relationship of the two signals input to the comparing unit 31 is switched, an output signal of the comparing unit is inverted. At this point in time, the latch unit 32 latches the logical state corresponding to the low-order phase signal received from the VCO 34a, and the counter 33 latches the count value. The low-order phase signal latched in the latch unit 32 is binarized by an operation unit (not shown). As a result, digital data corresponding to the level of the analog signal Vin is obtained.

As described above, according to the present embodiment, as the reference signal generating circuit according to the first embodiment or the second embodiment is employed in the AD conversion circuit, the circuit size of the AD conversion circuit can be reduced.

Fourth Embodiment

Next, a fourth embodiment of the present invention will be described. The present embodiment will be described in connection with an imaging device employing the reference signal generating circuit according to the first embodiment or the second embodiment. A constitution of the imaging device according to the present embodiment is similar to the constitution of the imaging device illustrated in FIG. 9 except that the reference signal generating circuit according to the first embodiment or the second embodiment is applied as the reference signal generating circuit 1010 of the imaging device illustrated in FIG. 9. In the present embodiment, the control unit 1020 has the function of the block control unit 17 as well. An operation of the imaging device according to the present embodiment is the same as that of the imaging device illustrated in FIG. 9.

As described above, according to the present embodiment, as the reference signal generating circuit according to the first embodiment or the second embodiment is employed in the imaging device, the circuit size of the imaging device can be reduced.

The exemplary embodiments of the present invention have been described so far, but the present invention is not limited to the above embodiments. Addition, omission, replacement, and other changes of a constitution can be made within the scope not departing from the gist of the present invention. The present invention is not limited by the above description and limited by only the appended claims.

What is claimed is:

1. A reference signal generating circuit, comprising:
a clock generating unit that comprises a delay section including delay units, each of which delays an input signal and outputs a delayed signal, and configured to output a plurality of clocks which are used to compose a low-order phase signal based on a signal output from the delay section;
a high-order current source cell unit that comprises high-order current source cells, each of which generates a same constant current;
a low-order current source cell unit that comprises low-order current source cells weighted to generate constant currents having current values that differ by a predetermined proportion of a current value of the constant current generated by each of the high-order current source cells;
an adding unit configured to add the constant current generated by the high-order current source cell unit and the constant current generated by the low-order current source cell unit;
a converting unit configured to convert an electric current obtained by addition by the adding unit into a voltage, and outputs the voltage;
a high-order bit control unit configured to select the high-order current source cell based on a divided clock obtained by dividing one of the plurality of the clocks; and
a data selecting circuit configured to select the low-order current source cell based on a pulse that is generated at a time interval based on a period of the divided clock and generated at a timing based on rising or falling of each of the plurality of the clocks.

2. A reference signal generating circuit, comprising:
a clock generating unit that comprises a delay section including delay units, each of which delays an input signal and outputs a delayed signal, and configured to output a plurality of clocks which are used to compose a low-order phase signal based on a signal output from the delay section;
a high-order current source cell unit that comprises high-order current source cells, each of which generates a same constant current;
a low-order current source cell unit that includes low-order current source cells, each of which generates a constant current having a current value of a predetermined proportion of a current value of the constant current generated by each of the high-order current source cells;
an adding unit configured to add the constant current generated by the high-order current source cell unit and the constant current generated by the low-order current source cell unit;
a converting unit configured to convert an electric current obtained by addition by the adding unit into a voltage, and outputs the voltage;
a high-order bit control unit configured to select the high-order current source cell based on a divided clock obtained by dividing one of the plurality of the clocks; and
a data selecting circuit configured to select the low-order current source cell based on a pulse that is generated at a timing based on rising or falling of each of the plurality of the clocks and generated at a time interval based on a period of the divided clock.

3. The reference signal generating circuit according to claim 1,
wherein the data selecting circuit selects the low-order current source cell based on a divided clock obtained by dividing each of the plurality of the clocks.

4. The reference signal generating circuit according to claim 2,
wherein the data selecting circuit selects the low-order current source cell based on a divided clock obtained by dividing each of the plurality of the clocks.

5. The reference signal generating circuit according to claim 1,
wherein the delay section comprises an annular delay circuit including the delay units which are connected in a ring form.

6. The reference signal generating circuit according to claim 2,
wherein the delay section comprises an annular delay circuit including the delay units which are connected in a ring form.

7. An AD conversion circuit, comprising:
the reference signal generating circuit according to claim 1;
a comparing unit configured to compare an analog signal serving as an AD conversion target with a reference signal based on the voltage output from the converting unit of the reference signal generating circuit, and to end a comparison process at a timing at which the reference signal satisfies a predetermined condition for the analog signal;
a latch unit configured to latch the low-order phase signal at a timing related to an end of the comparison process; and
a counter configured to count one of the plurality of the clocks or a divided clock obtained by dividing one of the plurality of the clocks as a count clock to acquire a high-order count value.

8. An AD conversion circuit, comprising:
the reference signal generating circuit according to claim 2;
a comparing unit configured to compare an analog signal serving as an AD conversion target with a reference signal based on the voltage output from the converting unit of the reference signal generating circuit, and to end a comparison process at a timing at which the reference signal satisfies a predetermined condition for the analog signal;
a latch unit configured to latch the low-order phase signal at a timing related to an end of the comparison process; and
a counter configured to count one of the plurality of the clocks or a divided clock obtained by dividing one of the plurality of the clocks as a count clock to acquire a high-order count value.

9. An imaging device, comprising:
an imaging unit that comprises a plurality of pixels, each of which includes a photoelectric conversion element and configured to output a pixel signal, the plurality of pixels being arranged in a matrix form; and
the AD conversion circuit according to claim 7 to which the analog signal corresponding to the pixel signal is input.

10. An imaging device, comprising:
an imaging unit that comprises a plurality of pixels, each of which includes a photoelectric conversion element and configured to output a pixel signal, the plurality of pixels being arranged in a matrix form; and
the AD conversion circuit according to claim 8 to which the analog signal corresponding to the pixel signal is input.

* * * * *